United States Patent
Sunohara et al.

(10) Patent No.: US 7,084,006 B2
(45) Date of Patent: Aug. 1, 2006

(54) ELECTRONIC PARTS PACKAGING STRUCTURE AND METHOD OF MANUFACTURING THE SAME

(75) Inventors: Masahiro Sunohara, Nagano (JP); Kei Murayama, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/904,087

(22) Filed: Oct. 22, 2004

(65) Prior Publication Data

US 2005/0042801 A1 Feb. 24, 2005

Related U.S. Application Data

(62) Division of application No. 10/704,156, filed on Nov. 10, 2003, now Pat. No. 6,930,392.

(30) Foreign Application Priority Data

Nov. 11, 2002 (JP) ............................. 2002-327006

(51) Int. Cl.
*H01L 21/44* (2006.01)
(52) U.S. Cl. ...................... 438/106; 257/758
(58) Field of Classification Search ............... None
See application file for complete search history.

(56) References Cited

U.S. PATENT DOCUMENTS

| 6,169,325 | B1 * | 1/2001 | Azuma et al. ............... 257/685 |
| 6,309,912 | B1 | 10/2001 | Chiou et al. ................ 438/118 |
| 6,319,754 | B1 * | 11/2001 | Wang et al. ................. 438/113 |
| 6,396,143 | B1 * | 5/2002 | Kimbara et al. ............ 257/712 |
| 2001/0008794 | A1 * | 7/2001 | Akagawa ..................... 438/620 |
| 2002/0053730 | A1 | 5/2002 | Mashino ...................... 257/690 |

FOREIGN PATENT DOCUMENTS

| EP | 0 607 656 | 7/1994 |
| JP | 2001-196525 | 7/2001 |
| JP | 2001-274034 | 10/2001 |

* cited by examiner

*Primary Examiner*—Thao P. Le
(74) *Attorney, Agent, or Firm*—Armstrong, Kratz, Quintos, Hanson & Brooks, LLP.

(57) ABSTRACT

There are provided the steps of forming a wiring pattern in an area except packaging area on a mounted body, the package area in which electronic parts is mounted, mounting the electronic parts in the packaging area of the mounted body to direct a surface of the electronic parts, of which a connection terminal is formed, upward, and forming an insulating film which covers the electronic parts and the wiring pattern.

7 Claims, 12 Drawing Sheets

US 7,084,006 B2

ELECTRONIC PARTS PACKAGING STRUCTURE AND METHOD OF MANUFACTURING THE SAME

This application is a divisional application of U.S. Patent application Ser. No. 10/704,156 filed Nov. 10, 2003 now U.S. Pat. No. 6,930,392.

BACKGROUND OF THE INVENTION

1. Field of the Invention

The present invention relates to an electronic parts packaging structure and a method of manufacturing the same and, more particularly, an electronic parts packaging structure in which semiconductor chips, etc. are mounted on a wiring substrate in a state that they are buried in an insulating film and a method of manufacturing the same.

2. Description of the Related Art

The development of the LSI technology as a key technology to implement multimedia devices is proceeding steadily to a higher speed and a larger capacity of the data transmission. According to this, a higher density of the packaging technology as interfaces between the LSI and electronic devices is also proceeding.

In reply to the request of a further higher density, the multichip package (semiconductor device) in which a plurality of semiconductor chips are laminated three-dimensionally on the substrate and packaged has been developed. As an example, in Patent Application Publication (KOKAI) 2001-196525 (Patent Literature 1), it is set forth that the semiconductor device having the structure in which a plurality of semiconductor chips are packaged three-dimensionally on the wiring substrate in a state that they are buried in the insulating layer and then the semiconductor chips are bonded to the wiring patterns, which are formed in a multi-layered fashion via the insulating layers, by the flip-chip bonding.

Also, in Patent Application Publication (KOKAI) 2001-274034 (Patent Literature 2), it is set forth that, in order to package the electronic parts at a high density and to shield the electronic parts from electronic noises that affect the electronic parts, the electronic parts package which contains the structure, in which the electronic parts are packaged in the concave portions provided to the core material and inner wall surfaces and bottom surfaces of the concave portions are made of the conductive metal, and in which a plurality of electronic parts are packaged.

However, in above Patent Literature 1, no consideration is given to the event that, when the interlayer insulating film is to be formed on the mounted semiconductor chips, such interlayer insulating film is formed to have differences in level due to a thickness of the semiconductor chips. In other words, if the steps are generated on the interlayer insulating film on the semiconductor chips, a focus margin in the photolithography applied in the step of forming the wiring patterns on this interlayer insulating film is reduced. Therefore, it is possible that it become difficult to form desired resist patterns with good precision.

In addition, differences in level also appear on the wiring patterns formed on the interlayer insulating film. Therefore, it is possible that, when the semiconductor chips are bonded to the wiring patterns by the flip-chip bonding, the reliability of such bonding is lowered.

Also, in Patent Literature 2, no consideration is given to the above problems caused when the semiconductor chips being buried in the interlayer insulating film are packaged over the wiring substrate having no concave portion thereon, in the technology of providing the concave portions on the core member and packaging the electronic parts in the concave portions.

SUMMARY OF THE INVENTION

It is an object of the present invention to provide an electronic parts packaging structure in which an interlayer insulating film on semiconductor chips is planarized and formed in the electronic parts packaging structure having a structure in which the semiconductor chips, etc. are buried in the interlayer insulating film on a base substrate, and a method of manufacturing the same.

The present invention provides a method of manufacturing an electronic parts packaging structure, which comprises the steps of forming wiring patterns in areas except packaging areas on a mounted body, in which electronic parts are mounted; mounting the electronic parts in the packaging areas of the mounted body to direct surfaces of the electronic parts, on which connection terminals are formed, upward; and forming an insulating film that covers the electronic parts and the wiring patterns.

In the present invention, first the wiring patterns are formed in areas except the areas on the mounted body (the insulating base substrate, the insulating film formed on the base substrate, or the like), in which electronic parts are mounted. Then, the electronic parts (semiconductor chips, or the like) are mounted with face up in the packaging areas of the mounted body. Then, the insulating film that covers the electronic parts and the wiring patterns is formed. Otherwise, the wiring patterns may be formed in areas except the packaging areas after the electronic parts are mounted on the mounted body.

In one preferred mode of the present invention, the upper surfaces of the electronic parts and the upper surfaces of the wiring patterns are formed at an almost same height. Therefore, since the wiring patterns act also as dummy patterns used to planarize differences in level of the electronic parts, the insulating film for covering the electronic parts and the wiring patterns is planarized over the entire upper surface.

Accordingly, in the situation that the overlying wiring patterns connected electrically to the electronic parts and the wiring patterns are to be formed on the insulating film, when the resist film is patterned by the photolithography, the underlying insulating film is planarized and thus a depth of focus in exposure can be set small. As a result, the desired overlying wiring patterns can be formed over the electronic parts stably with good precision.

In addition, differences in level are not generated on the overlying wiring patterns. Therefore, when the bumps of the electronic parts are flip-chip mounted on the overlying wiring patterns, variation in a bonded height can be eliminated. Therefore, reliability of the bonding between the bumps of the electronic parts and the overlying wiring patterns can be improved.

Further, in the case that the packaging areas of the electronic parts are secured by providing non-forming portions of the wiring pattern simultaneously in the step of forming the wiring patterns, manufacturing steps can be reduced rather than the method of planarizing the insulating film by the polishing in the later step. Thus, a production cost can be reduced.

Moreover, in one preferred mode of the present invention, when the wiring patterns are formed in areas except the packaging areas after the electronic parts are mounted on the mounted body, the resin film having a tackiness in its uncured state may be employed as the mounted body and then the electronic parts may be adhered onto the uncured resin film. Then, the resin film is cured by the annealing in the later step, and thus the electronic parts are firmly fixed to the resin film. If doing so, the step of forming the adhesive layer on the back surfaces (opposite surfaces to the connection terminal side) of the electronic parts is not required particularly. As a result, a production cost can be reduced.

DETAILED DESCRIPTION OF THE PREFERRED EMBODIMENTS

Embodiments of the present invention will be explained with reference to the accompanying drawings hereinafter.

Figure 1A:
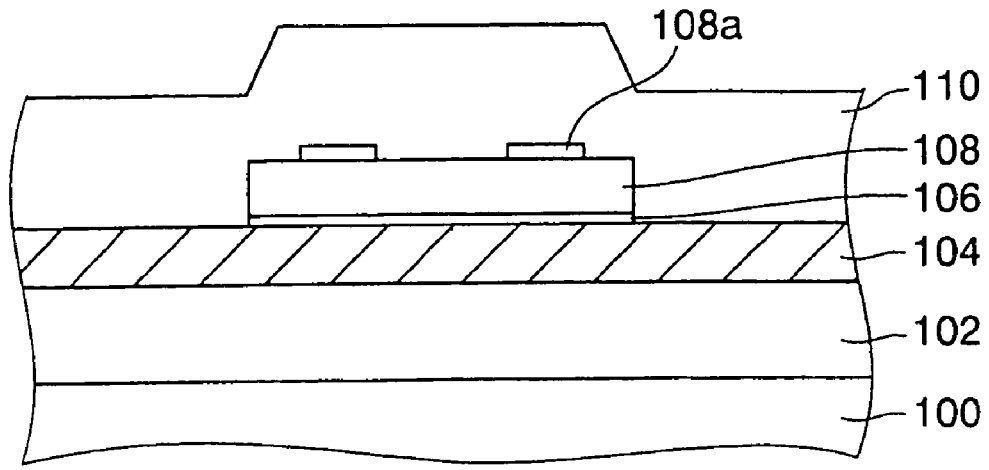
FIG. 1A and FIG. 1B are sectional views showing troubles in the manufacture of the semiconductor device in which semiconductor chips are buried and packaged in an insulating film.
Figure 1B:
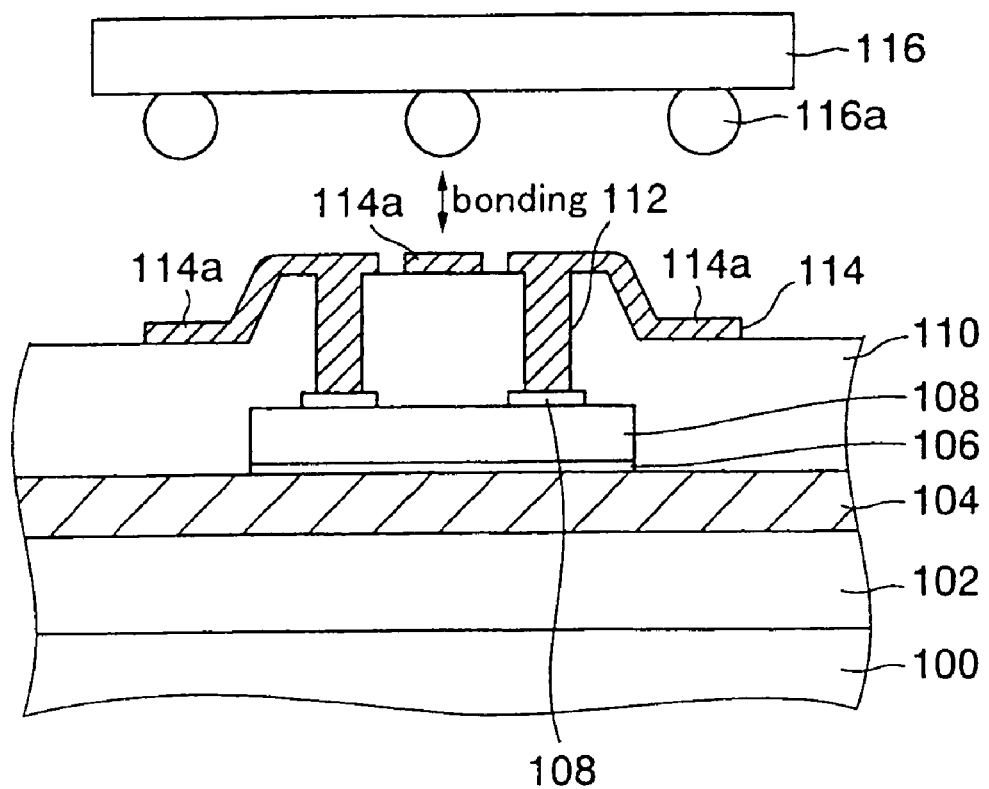

At first, troubles in the manufacture of the semiconductor device in which semiconductor chips are buried and packaged in the insulating film will be explained hereunder. FIG. 1A and FIG. 1B are sectional views showing troubles in the manufacture of the semiconductor device in which the semiconductor chips are buried and packaged in the insulating film.

As shown in FIG. 1A, first a first interlayer insulating film 102 is formed on a base substrate 100 having predetermined wiring patterns (not shown) thereon. Then, Cu wirings 104 which are connected to wiring patterns on the base substrate 100 via via holes (not shown) formed in the first interlayer insulating film 102 are formed on the first interlayer insulating film 102. Semiconductor chips 108 having connection terminals 108a thereon are adhered onto the Cu wirings 104 via an adhesive layer 106 so as to direct their connection terminals 108a upwardly.

Then, a second interlayer insulating film 110 is formed on the semiconductor chips 108 and the Cu wirings 104. At this time, the second interlayer insulating film 110 is formed such that such second interlayer insulating film 110 on the semiconductor chips 108 is risen high rather than that on the Cu wirings 104 due to a height of the semiconductor chips 108.

Then, As shown in FIG. 1B, the second interlayer insulating film 110 on the connection terminals 108a of the semiconductor chips 108, etc. are etched by the laser, or the like to form via holes 112. Then, a seed Cu film (not shown) is formed on inner surfaces of the via holes 112 and an upper surface of the second interlayer insulating film 110. Then, a resist film (not shown) having opening portions in which wiring patterns are formed is formed by the photolithography.

Then, Cu film patterns are formed in the opening portions of the resist film pattern by the electroplating utilizing the seed metal film as the plating power-supply layer. Then, the resist film is removed. Then, wiring patterns 114 are obtained by etching the seed Cu film while using the Cu film patterns as a mask.

Since differences in level are caused on the upper surface of the second interlayer insulating film 110 by the influence of the semiconductor chips 108, a focus margin in exposure is reduced in the step of forming the resist film patterns by the above photolithography. Therefore, it is difficult to desired resist film patterns on the second interlayer insulating film 110 with good precision, and thus it is difficult to form the desired wiring patterns 114 with good precision.

In turn, bumps 116a of semiconductor chips 116 are bonded to connecting portions 114a of the wiring patterns 114 by the flip-chip bonding. At this time, since a height of the connecting portions 114a of the wiring patterns 114 is varied due to differences in level of the second interlayer insulating film 110, the bonding failure between the bumps 116a of the semiconductor chips 116 and the connecting portions 114a of the wiring patterns 114 are generated readily.

Electronic parts packaging structures according to respective embodiments of the present invention can overcome the above subjects.

(First Embodiment)

Figure 2A:
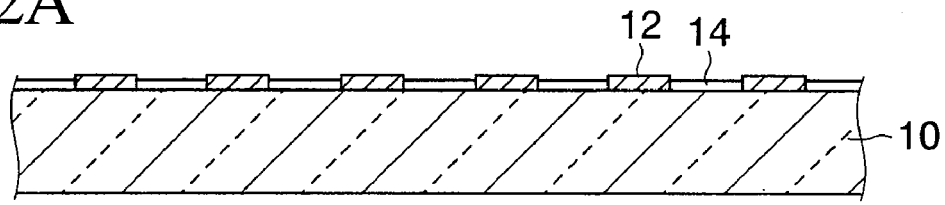
FIG. 2A to FIG. 2N are partial sectional views showing a method of manufacturing an electronic parts packaging structure according to a first embodiment of the present invention.

Next, a method of manufacturing an electronic parts packaging structure according to a first embodiment of the present invention will be explained hereunder. FIG. 2A to FIG. 2N are partial sectional views showing the method of manufacturing the electronic parts packaging structure according to the first embodiment of the present invention.

As shown in FIG. 2A, first a silicon wafer 10 (semiconductor wafer) on which predetermined transistors, multilayered wirings (not shown), etc. are formed and which has a thickness of about 400 μm is prepared. Connection terminals 12 made of Al, or the like are exposed from an upper surface of the silicon wafer 10. Portions except the connection terminals 12 are covered with a passivation film 14 made of a silicon nitride film, a polyimide resin, or the like.

Figure 2B:
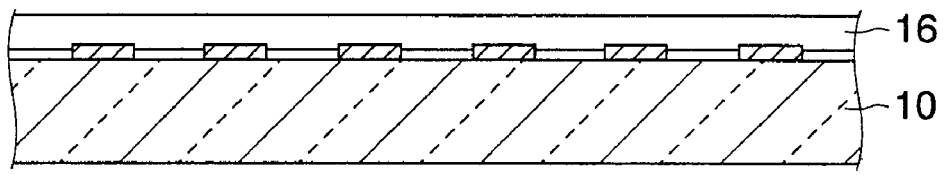

Then, as shown in FIG. 2B, mask member 16 is pasted on a surface of the silicon wafer 10 on the connection terminal 12 side (referred to as an element formation surface hereinafter). As the mask member 16, a BG (Backside Grinding) tape that is formed by coating a UV-curing acrylic resin on PET or polyethylene base member, a resist film made of a polyimide resin (photosensitive or anti-photosensitive), or the like is employed. The BG tape is laminated on the silicon wafer 10 by the roller press at a normal temperature and a pressure of 100 Pa. Also, the resist film is formed by coating a coating liquid on the silicon wafer 10 at 300 rpm, then uniformizing the coating liquid over the overall surface at 3000 rpm, and then applying the annealing to the coating liquid.

Figure 2C:
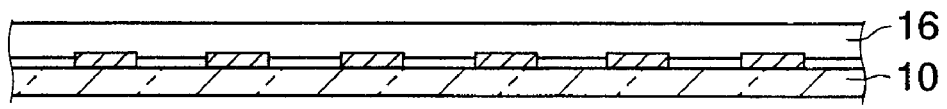

Then, as shown in FIG. 2C, an element non-formation surface (referred to as a "back surface" hereinafter) of the silicon wafer 10, an element forming surface of which is protected by the mask member 16, is ground by the grinder. Thus, a thickness of the silicon wafer 10 is reduced to about 50 μm or less, preferably 25 μm or less, and more preferably about 10 to 15 μm.

Figure 2D:
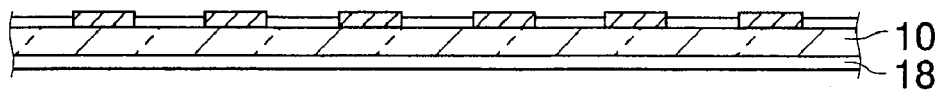

Then, as shown in FIG. 2D, the mask member 16 formed on the element formation surface of the silicon wafer 10 is removed, and then a die attaching member 18 is formed on the back surface (grinding surface) of the silicon wafer 10. This die attaching member 18 acts as the adhesive layer when semiconductor chips that are divided from the silicon wafer 10 into individual pieces are mounted onto the mounted body by the later step.

As the die attaching member 18, an epoxy resin film, a conductive paste, or the like is used. In this case, it is preferable that, if a coefficient of thermal expansion (CTE) and a thermal conductivity are adjusted to desired values for convenience of packaging, the epoxy resin film containing fillers such as silica, metal powder, or the like should be employed. Otherwise, it is preferable that, if the thermal conductivity is set high for convenience of packaging, the conductive paste should be employed. If the resin film is used as the die attaching member 18, such resin film is pressed onto the back surface of the silicon wafer 10 at 100 to 130° C. and at about 0.5 Mpa and pasted thereon.

A thickness of the die attaching member 18 is almost 5 to 10 μm. It is preferable that a total thickness of the silicon wafer 10 and the die attaching member 18 should be set to about 20 μm or less.

Figure 2E:
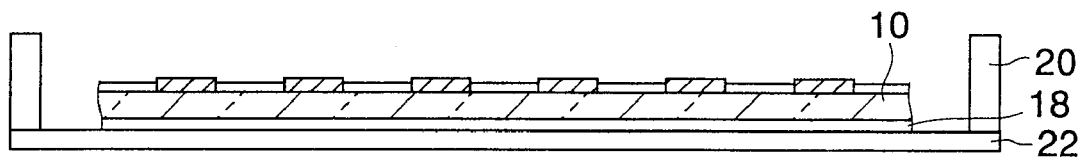

Then, as shown in FIG. 2E, a dicing tape 22 fixed to an outer frame 20 is prepared. A surface of the die attaching member 18 of the silicon wafer 10 is fixed temporarily to the dicing tape 22 at a temperature of 100 to 130° C.

Figure 2F:
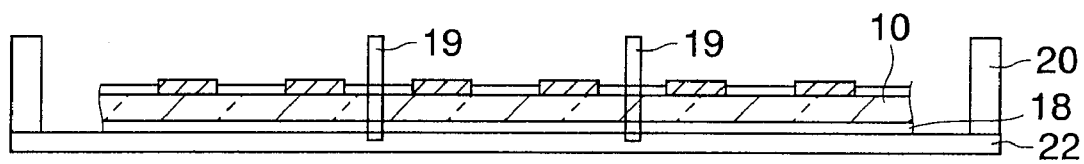

Then, as shown in FIG. 2F, the silicon wafer 10 is diced by the dicing saw having the dicing blade 19. In this dicing step, the diamond blade constructed by binding diamond grindstones whose grain size is about 2 to 10 μm with the resin is used as the dicing blade 19. Then, the silicon wafer 10 is diced by two-stage step cutting. In other words, first, in the first stage, a notch is put in the upper side area of the silicon wafer 10 with the blade that is fitted to the first spindle. Then, the remaining lower side area of the silicon wafer 10 and the die attaching member 18 are cut with the blade that is fitted to the second spindle, and then a notch is put in the upper side area of the dicing tape 22. At this time, for example, the work feeding speed is set to about 30 to 100 mm/sec, and the number of revolution of the spindle is set to 4000 to 5000 rpm.

In this manner, the silicon wafer 10 is divided into individual semiconductor chips 11 in a situation that such silicon wafer 10 is fixed temporarily to the dicing tape 22.

Figure 2G:
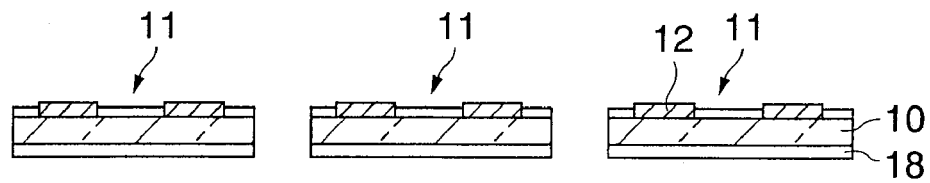

Then, as shown in FIG. 2G, individual semiconductor chips 11 are picked up from the dicing tape 22. As the method of picking up the semiconductor chips 11, there are the method of pushing up the semiconductor chips 11 from the back surface of the dicing tape 22 by the needles, and also the needleless method of releasing the semiconductor chips 11 by expanding the dicing tape 22 by virtue of the UV irradiation and the heating without the needles.

In this manner, a plurality of semiconductor chips 11 (electronic parts), a thickness of each of which is thinned to about 10 to 15 μm and on the back surface of each of which the die attaching member 18 is formed, can be obtained. The semiconductor chip 11 is an example of the electronic parts, and in addition various parts such as the capacitor parts, etc. may be employed.

Next, an example of the wiring substrate on which the above semiconductor chips 11 are mounted will be explained hereunder.

Figure 2H:
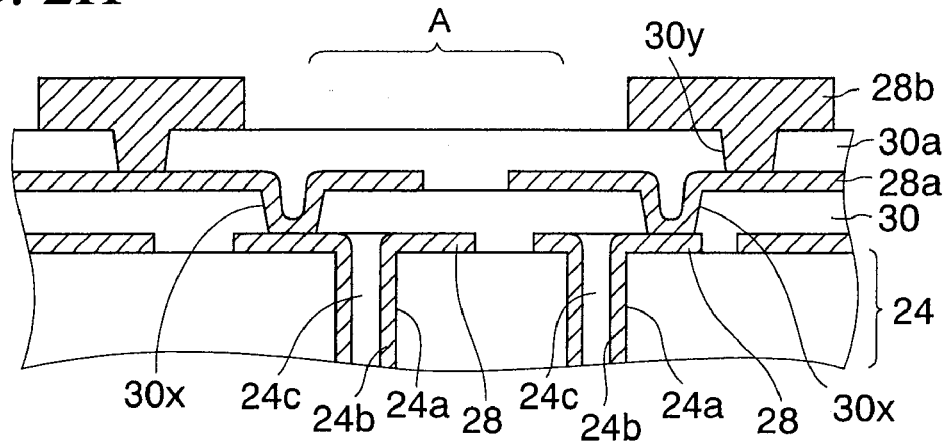

As shown in FIG. 2H, first a base substrate 24 used to manufacture a built-up wiring substrate is prepared. The base substrate 24 is made of insulating material such as a resin, or the like. Also, through holes 24a are provided in the base substrate 24. A through-hole plating layer 24b coupled to a first wiring pattern 28 on the base substrate 24 is formed on inner surfaces of the through holes 24a. The through holes are buried with a resin 24c.

Then, a first interlayer insulating film 30 for covering the first wiring patterns 28 is formed. As the first interlayer insulating film 30, for example, epoxy resin, polyimide resin, or polyphenylene ether resin may be employed. In other words, the resin layer is formed by laminating the resin film on the first wiring patterns 28 and then curing the resin film by the annealing executed at 80 to 140° C.

In this case, the resin film as the first interlayer insulating film 30 may be formed by the spin coating method or the printing method in addition to the above method of laminating the resin film. Also, in addition to the resin film, an inorganic insulating film such as a silicon oxide film formed by the CVD method, or the like may be employed.

Then, first via holes 30x are formed in predetermined portions of the first interlayer insulating film 30 on the first wiring patterns 28.

Then, second wiring patterns 28a are formed on the first interlayer insulating film 30 by the semi-additive process. In more detail, a seed Cu layer (not shown) is formed on inner surfaces of the first via holes 30x and an upper surface of the first interlayer insulating film 30 by the electroless plating, and then a resist film (not shown) having opening portions in predetermined patterns is formed. Then, Cu film patterns are formed in the opening portions of the resist film by the electroplating using the seed Cu layer as the plating power-supply layer. Then, the resist film is removed, and then the seed Cu layer is etched by using the Cu film patterns as a mask. As a result, the second wiring patterns 28a connected to the first wiring patterns 28 via the first via holes 30x are formed.

Then, a second interlayer insulating film 30a made of the same material as the first interlayer insulating film 30 is formed on the second wiring patterns 28a, and then second via holes 30y for exposing predetermined portions of the second wiring patterns 28a are formed.

Then, according to the same method as the above method of forming the second wiring patterns 28a, third wiring patterns 28b connected to the second wiring patterns 28a via the second via holes 30y are formed. At this time, the third wiring patterns 28b are not formed in packaging areas A in each of which the above semiconductor chip 11 is mounted by the later step.

In other words, when the second wiring patterns 28a are formed by the semi-additive process, the resist film may be formed in predetermined patterns to mask the packaging areas A, in the step of forming the resist film out of the above steps of forming the second wiring patterns 28a.

In addition, a film thickness of the third wiring patterns 28b is set almost equally to a total thickness of the semiconductor chip 11 and the die attaching member 18. For example, if a total thickness of the semiconductor chip 11 and the die attaching member 18 is 20 μm, a film thickness of the third wiring patterns 28b is set to about 20 μm±5 μm.

In this case, the second wiring patterns 28a and the third wiring patterns 28b may be formed by the subtractive process or the full additive process in addition to the semi-additive process.

Also, in the above mode, when the third wiring patterns 28b are to be formed, the wiring non-formation portions in the packaging areas A and the wiring patterns are formed simultaneously. But first the wiring patterns may be formed in a state that the Cu film is still left in the packaging areas A, and then the Cu film in the packaging areas may be removed. In this case, the Cu film in the packaging areas A is removed by the wet etching, the dry etching, the drill, the laser, or the like.

Figure 2I:
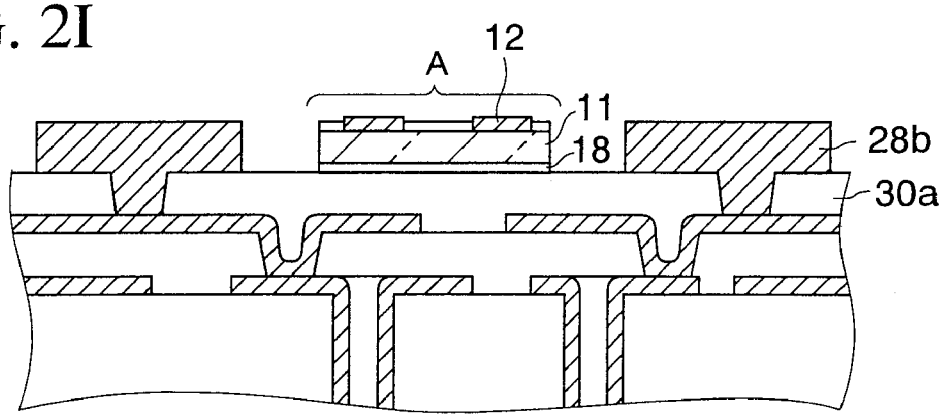

Then, as shown in FIG. 2I, a surface of the die attaching member 18 of the above semiconductor chip 11 is adhered onto the packaging area A in which the third wiring pattern 28b is not formed on the second interlayer insulating film 30a. That is, the semiconductor chip 11 is mounted while directing its element formation surface containing the connection terminal 12 upward (face up). At this time, for the reason described above, the semiconductor chips 11 are mounted in such a manner that their element formation surfaces (upper surfaces) are set at the substantially same height as upper surfaces of the third wiring patterns 28b.

Figure 2J:
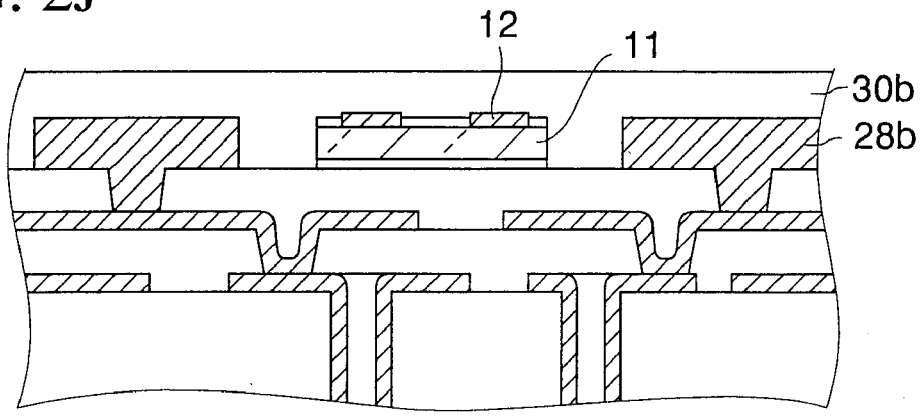

Then, as shown in FIG. 2J, a third interlayer insulating film 30b made of the same material as the first interlayer insulating film 30 is formed on the resultant structure in FIG. 2I. At this time, since upper surfaces of the semiconductor chips 11 and the third wiring patterns 28b are formed at an almost same height, the third interlayer insulating film 30b is never formed to rise locally on the semiconductor chips 11 and thus is formed as a planarized surface over the entire structure.

Here, the third wiring patterns 28b in vicinity of the semiconductor chips 11 may be formed like a frame that surrounds an outer periphery of the semiconductor chip 11. In this case, the flatness of the third interlayer insulating film 30b can be further improved.

Figure 2K:
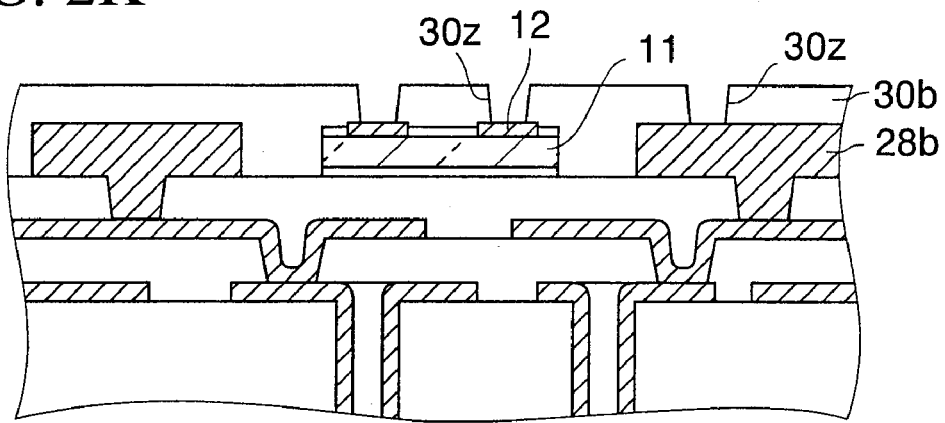

Then, as shown in FIG. 2K, the third interlayer insulating film 30b on the connection terminals 12 of the semiconductor chips 11 and the third wiring patterns 28b is etched by the laser, or the like. Thus, third via holes 30z are formed.

Figure 2L:
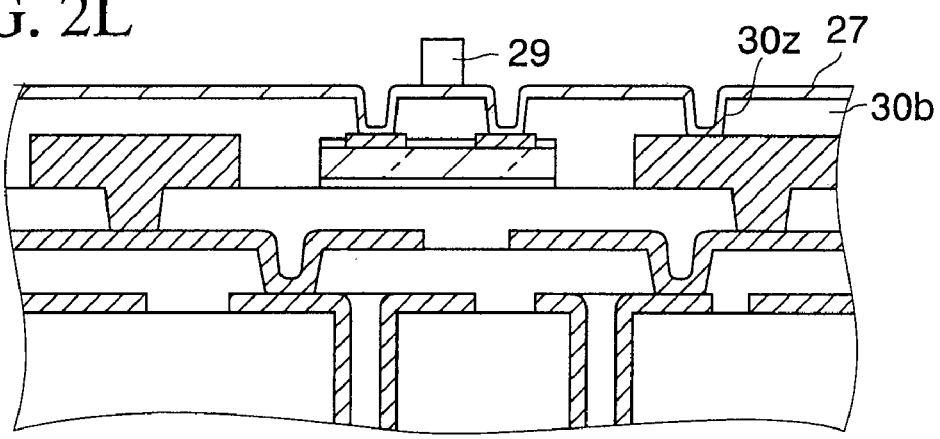

Then, as shown in FIG. 2L, according to the same method as the above method of forming the second wiring patterns 28a, a seed Cu film 27 is formed on inner surfaces of the third via holes 30z and an upper surface of the third interlayer insulating film 30b. Then, a resist film 29 having opening portions, which correspond to the fourth wiring patterns, is formed by the photolithography. At this time, since the third interlayer insulating film 30b is formed and planarized over the entire surface, a defocusing in exposure is not generated. Therefore, the desired resist film 29 can be formed with good precision.

Figure 2M:
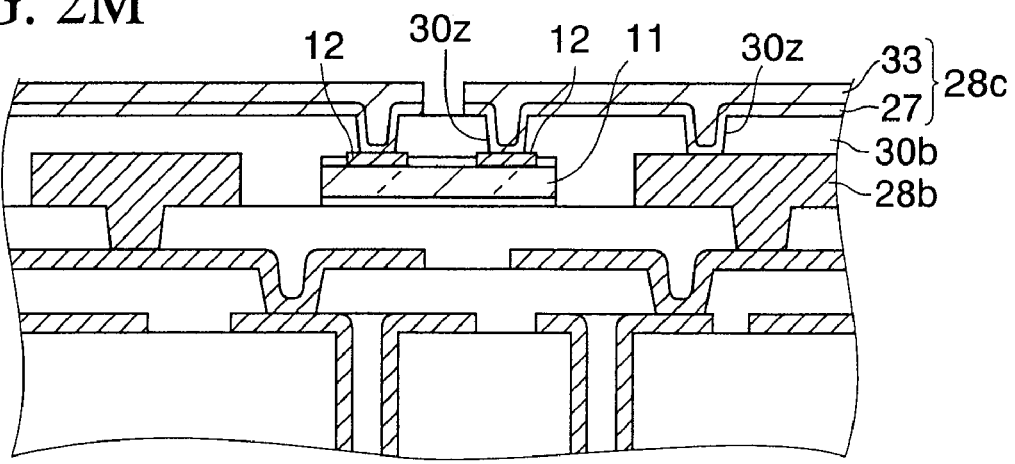
Figure 2N:
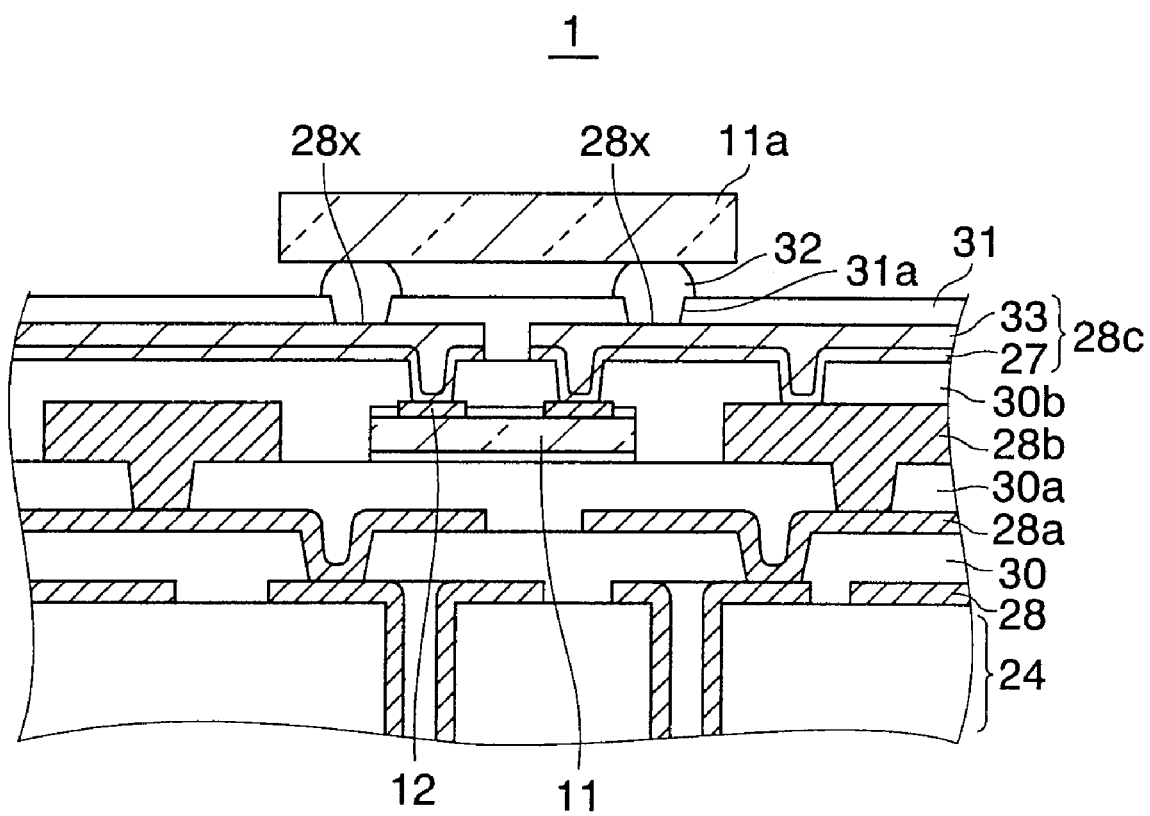

Then, as shown in FIG. 2M, Cu film patterns 33 are formed by the electroplating using the seed Cu film 27 as the plating power-supply layer while using the resist film 29 as a mask. Then, the resist film 29 is removed. Then, the seed Cu film 27 is etched by using the Cu film patterns 33 as a mask. Accordingly, fourth wiring patterns 28c connected to the connection electrodes 12 of the semiconductor chip 11 and the third wiring patterns 28b via the third via holes 30z are formed.

In this manner, since the upper surface of the third interlayer insulating film 30b for covering the semiconductor chip 11 via is made flat, there is no necessity to set a depth of focus largely in the photolithography applied to form the fourth wiring patterns 28c on the third interlayer insulating film 30b. Therefore, the resist film 29 having the opening portions, which correspond to the fourth wiring patterns 28c, can be formed stably with good precision. As a result, the desired fourth wiring patterns 28c can be formed stably with good precision.

Then, as shown in FIG. 2N, a solder resist film 31 having opening portions 31a at its connecting portions 28x is formed on the fourth wiring patterns 28c. Then, a semiconductor chip 11a having bumps 32 is prepared, and then the bumps 32 of the semiconductor chip 11a are bonded to the connecting portions 28x of the fourth wiring patterns 28c by the flip-chip bonding. In this case, Ni/Au plating is applied to the connecting portions 28x of the fourth wiring patterns 28c.

At this time, the connecting portions 28x of the fourth wiring patterns 28c are arranged at an almost identical height without variation in height in the area which is over the semiconductor chip 11 and in which the semiconductor chip 11 is not present. Therefore, the bumps 32 of the semiconductor chip 11 a can be bonded to the connecting portions 28x with good reliability.

In this case, the bumps may be formed by mounting solder balls on the opening portions 31a in the solder resist film 31, or the like, and then the connecting terminals of the semiconductor chip 11a may be bonded to the bumps.

With the above, a semiconductor device 1 (electronic parts packaging structure) according to the first embodiment of the present invention is completed.

Here, the mode that the semiconductor chips 11 are buried in the third interlayer insulating film 30b is exemplified. But the semiconductor chips 11 may be buried in the first interlayer insulating film 30 or the second interlayer insulating film 30a. In this case, the semiconductor chips 11 may be mounted on the base substrate 24 or the first interlayer insulating film 30 and also a film thickness of the first wiring patterns 28 or the second wiring patterns 28a may be set substantially identically to a thickness of the semiconductor chips 11.

Also, the mode that one semiconductor chip 11 is buried in the interlayer insulating film and packaged is exemplified. However, for example, like the third wiring patterns 28b, the fourth wiring patterns 28c may be formed in the step in FIG. 2M to avoid the packaging areas of the semiconductor chips 11, and then the semiconductor chips 11 may be mounted on the third interlayer insulating film 30b. That is to say, the mode that a plurality of semiconductor chips are mounted in a multi-layered fashion and connected mutually in the state that such semiconductor chips are buried in a plurality of interlayer insulating films respectively to have the same structure may be employed. In such case, since such interlayer insulating films are planarized and formed respectively, the interlayer insulating films, in which the semiconductor chips 11 are built, and the wiring patterns may be laminated without problems.

In this fashion, the mounted body on which the semiconductor chips 11 are to be mounted is the base substrate 24 or the interlayer insulating films 30 to 30b in respective built-up layers.

In the semiconductor device 1 according to the first embodiment, the first to third interlayer insulating films 30 to 30b and the first to fourth wiring patterns 28 to 28c are laminated and formed on the base substrate 24. Then, the semiconductor chips 11 are mounted with face up on packaging areas, in which the third wiring patterns 28b are not formed on the second interlayer insulating film 30a, in the state that they are buried in the third interlayer insulating film 30b. In addition, the film thickness of the third wiring patterns 28b that are formed on the second interlayer insulating film 30a, on which the semiconductor chips 11 are mounted, is formed almost identically to the thickness of the semiconductor chips 11.

The connection terminals 12 of the semiconductor chips 11 are connected electrically to the semiconductor chip 11a, which is arranged three-dimensionally over the semiconductor chip 11, via the fourth wiring patterns 28c.

In the semiconductor device 1 according to the first embodiment, the semiconductor chips 11 are not formed on the third wiring patterns 28b, but the semiconductor chips 11 are arranged in the areas of the second interlayer insulating film 30a in which the third wiring patterns 28b are not formed. Then, since thicknesses of the semiconductor chips 11 and the third wiring patterns 28b are set almost equally mutually, the third interlayer insulating film 30b on the semiconductor chips 11 can be formed in a flat state without influence of the difference in level caused by the semiconductor chips 11. Therefore, the fourth wiring patterns 28c to be formed on the third interlayer insulating film 30b can be formed stably with good precision without influence of the difference in level caused by the semiconductor chips 11.

Further, a height of the connecting portions 28x of the fourth wiring patterns 28c formed over the semiconductor chips 11 becomes constant. Therefore, a coplanarity of the bonding between the connecting portions 28x of the fourth wiring patterns 28c and the bumps 32 of the semiconductor chips 11a can be made small. As a result, generation of the bonding failure (bridge, open, etc.) between the connecting portions 28x of the fourth wiring patterns 28c and the bumps 32 of the semiconductor chips 11a can be prevented.

(Second Embodiment)

FIG. 3A to FIG. 3K are partial sectional views showing a method of manufacturing an electronic parts packaging structure according to a second embodiment of the present invention. A different point of the second embodiment from the first embodiment reside in that the semiconductor chips are adhered onto the interlayer insulating film not by forming particularly the die attaching member 18 on the back surfaces of the semiconductor chips 11 but by giving the tackiness to the interlayer insulating film on which the semiconductor chips 11 are mounted. In this case, detailed explanation of the same steps as those in the first embodiment will be omitted herein. Also, in FIG. 3A to FIG. 3K, the same reference symbols are affixed to the same elements as those in FIG. 2A to FIG. 2N, and their explanation will be omitted herein.

Figure 3A:
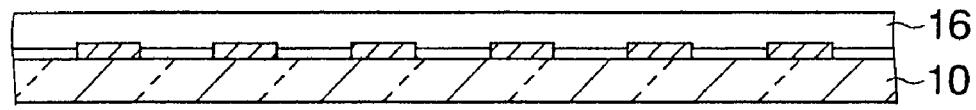
FIG. 3A to FIG. 3K are partial sectional views showing a method of manufacturing an electronic parts packaging structure according to a second embodiment of the present invention.

In the method of manufacturing the electronic parts packaging structure according to the second embodiment of the present invention, as shown in FIG. 3A, first the same structural body as that in FIG. 2C is obtained by the same method as the first embodiment. That is, the silicon wafer 10 in which the element formation surface is covered with the mask member 16 and also the thickness is reduced to 50 μm or less, preferably 10 to 15 μm by grinding the back surface is obtained. Here, in the present embodiment, the die attaching member is not formed on the back surface of the silicon wafer 10.

Figure 3B:
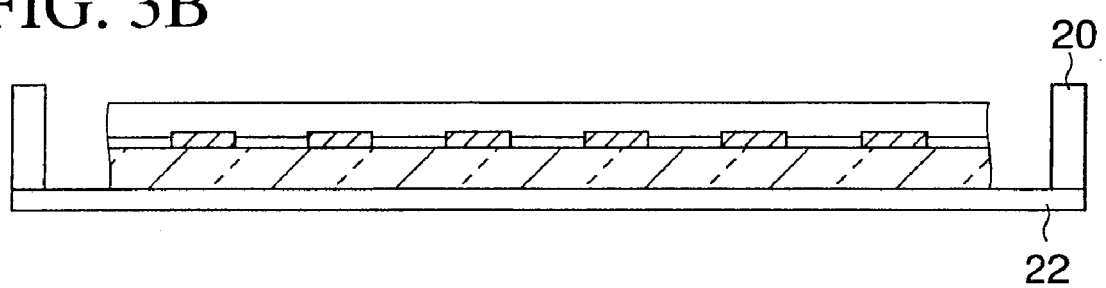
Figure 3C:
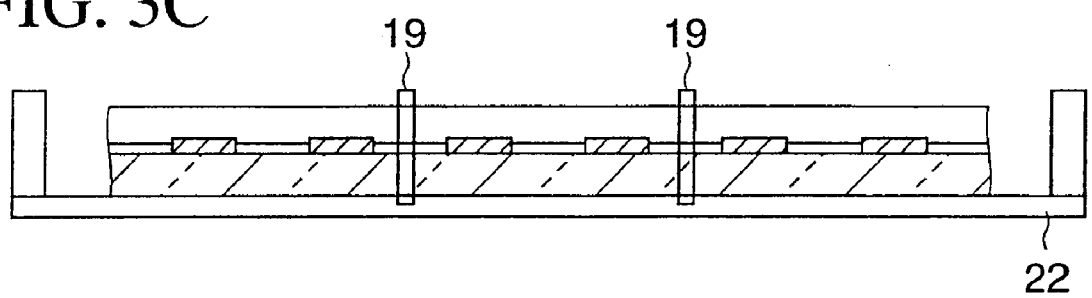
Figure 3D:
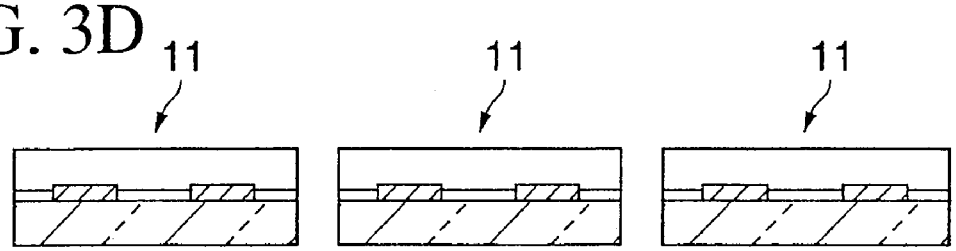

Then, as shown in FIG. 3B, the back surface (grinding surface) of the silicon wafer 10 is pasted onto the dicing tape 22. Then, as shown in FIG. 3C, the silicon wafer 10 is diced by the dicing saw having the dicing blade 19. Then, as shown in FIG. 3D, the semiconductor chips 11 are picked up from the dicing tape 22, whereby a plurality of semiconductor chips 11 that are divided into individual pieces are obtained.

Figure 3E:
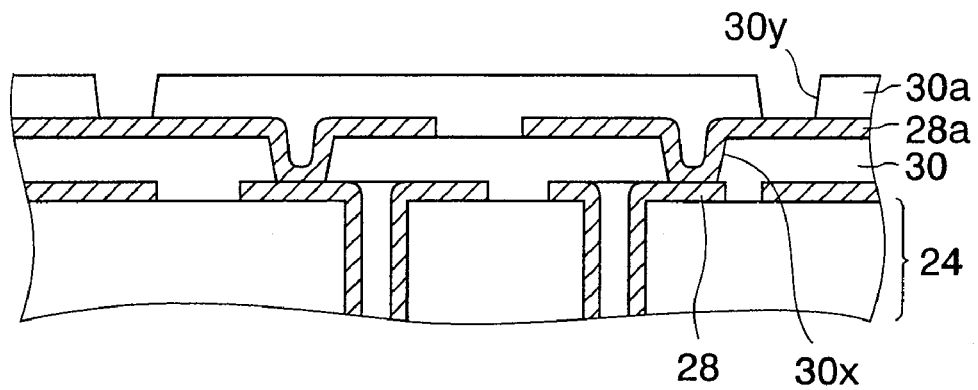

Then, as shown in FIG. 3E, according to the same method as the first embodiment, the first interlayer insulating film 30, the first via holes 30x, and the second wiring patterns 28a are formed on the base substrate 24 having the first wiring patterns 28 thereon.

Then, as shown similarly in FIG. 3E, the second interlayer insulating film 30a is formed by laminating the resin film on the second wiring patterns 28a without the annealing. In the second embodiment, the resin film having the tacky property (adhesiveness) in its uncured state is used as the second interlayer insulating film 30a. As the material of such resin film, epoxy resin, polyimide thermosetting resin, polyphenylene thermosetting resin, etc. may be employed. In this way, the second interlayer insulating film 30a having the tacky property (adhesiveness) is formed on the second wiring patterns 28a. Then, the second via holes 30x are formed by opening predetermined portions of the second interlayer insulating film 30a on the second wiring patterns 28a.

Figure 3F:
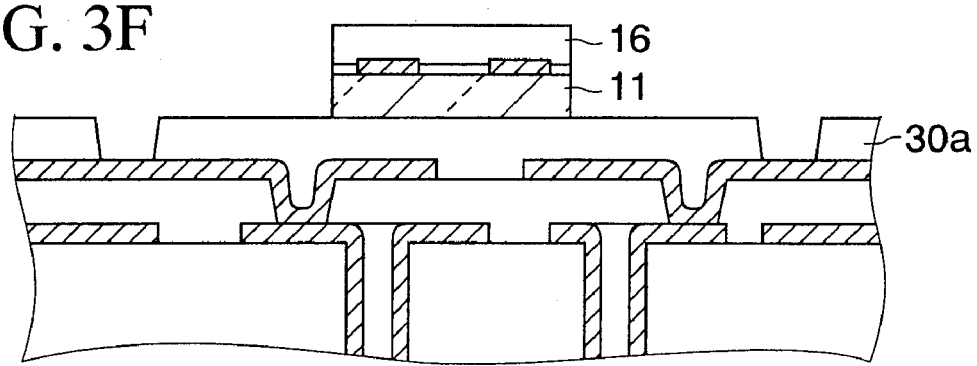

Then, as shown in FIG. 3F, the back surfaces of the above semiconductor chips 11 are adhered onto the second interlayer insulating film 30a having the tacky property (adhesiveness).

That is, the semiconductor chips 11 are mounted in the state that the connection terminal 12 becomes upward.

Then, the second interlayer insulating film (resin film) 30a is cured by executing the annealing at a temperature of about 150° C. Thus, the semiconductor chips 11 are firmly fixed to the second interlayer insulating film 30a. In the second embodiment, the back surfaces of the semiconductor chips 11 are firmly fixed to the second interlayer insulating film 30a in the situation that the element formation surfaces of the semiconductor chips 11 are covered with the mask member 16.

Figure 3G:
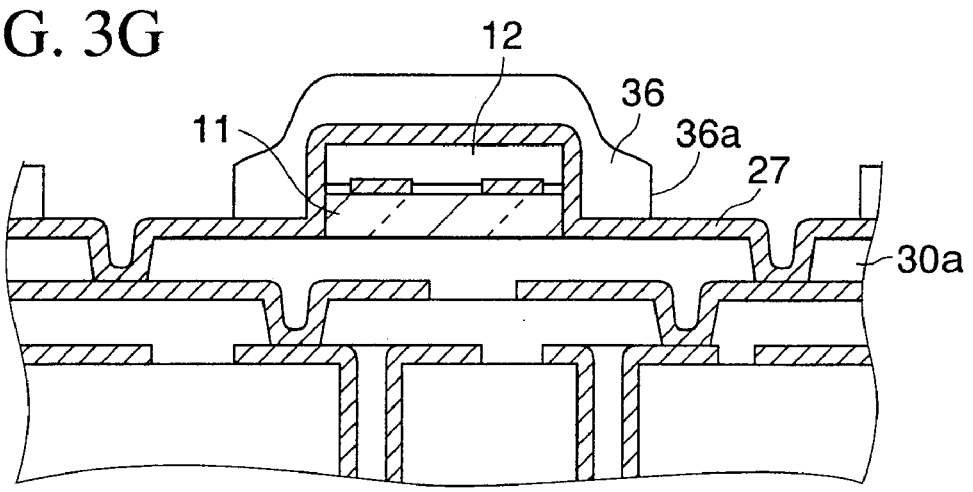

Then, as shown in FIG. 3G, the seed Cu film 27 is formed on the mask members 16 of the semiconductor chips 11 and the second interlayer insulating film 30a by the electroless plating. Then, a resist film 36 having opening portions 36a in areas in which the third wiring patterns are formed is formed on the seed Cu film 27.

Figure 3H:
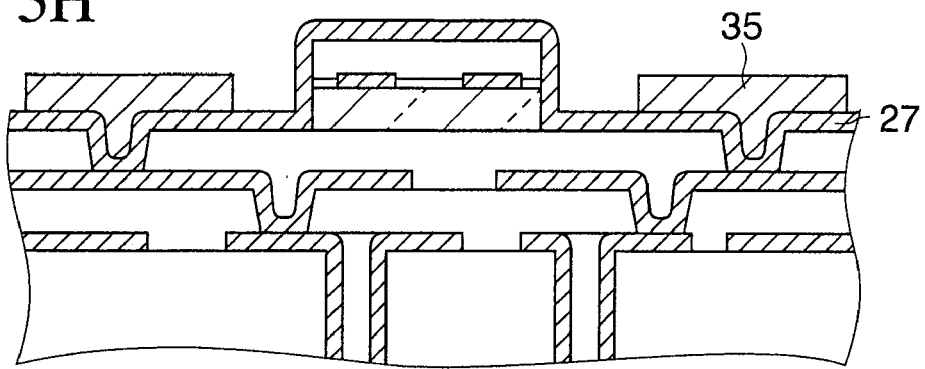

Then, as shown in FIG. 3H, a Cu film pattern 35 is formed by the electroplating utilizing the seed Cu film 27 as the plating power-supply layer while using the resist film 36 as a mask. Then, the resist film 36 is removed.

Figure 3I:
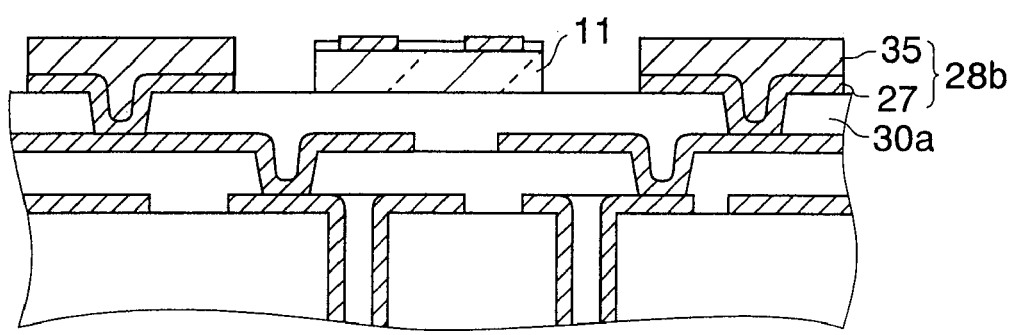

Then, as shown in FIG. 3I, the third wiring patterns 28b are formed by etching the seed Cu film 27 while using the Cu film pattern 35 as a mask. At this time, like the first embodiment, the third wiring patterns 28b are formed to have a film thickness that is almost equal to the thickness of the semiconductor chips 11. Then, the mask member 16 is removed from the semiconductor chip 11.

The above steps in FIG. 3G to FIG. 3I are carried out while covering the element formation surfaces of the semiconductor chips 11 with the mask member 16. Therefore, it is impossible that the element formation surfaces of the semiconductor chips 11 are damaged by the step of etching the seed Cu film 27, etc.

In this way, like the first embodiment, the semiconductor chips 11 can be mounted on the areas of the second interlayer insulating film 30a, in which the third wiring patterns 28b are not formed, and also the upper surfaces of the semiconductor chips 11 and the upper surfaces of the third wiring patterns 28b can be formed to have an almost equal height. In the second embodiment, as described above, the third wiring patterns 28b are formed in the areas of the second interlayer insulating film 30a except the packaging areas of the semiconductor chips 11 after the semiconductor chips 11 are mounted.

Figure 3J:
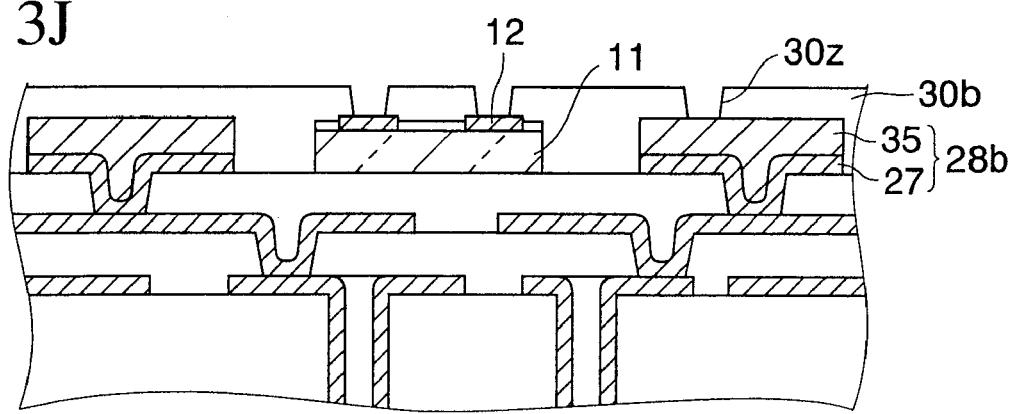

Then, as shown in FIG. 3J, according to the same method as the steps in FIG. 2J to FIG. 2K in the first embodiment, the third interlayer insulating film 30b for covering the semiconductor chips 11 and the third wiring patterns 28b is formed. Then, the third via holes 30z for exposing the connection terminals 12 of the semiconductor chips 11, etc. are formed.

Figure 3K:
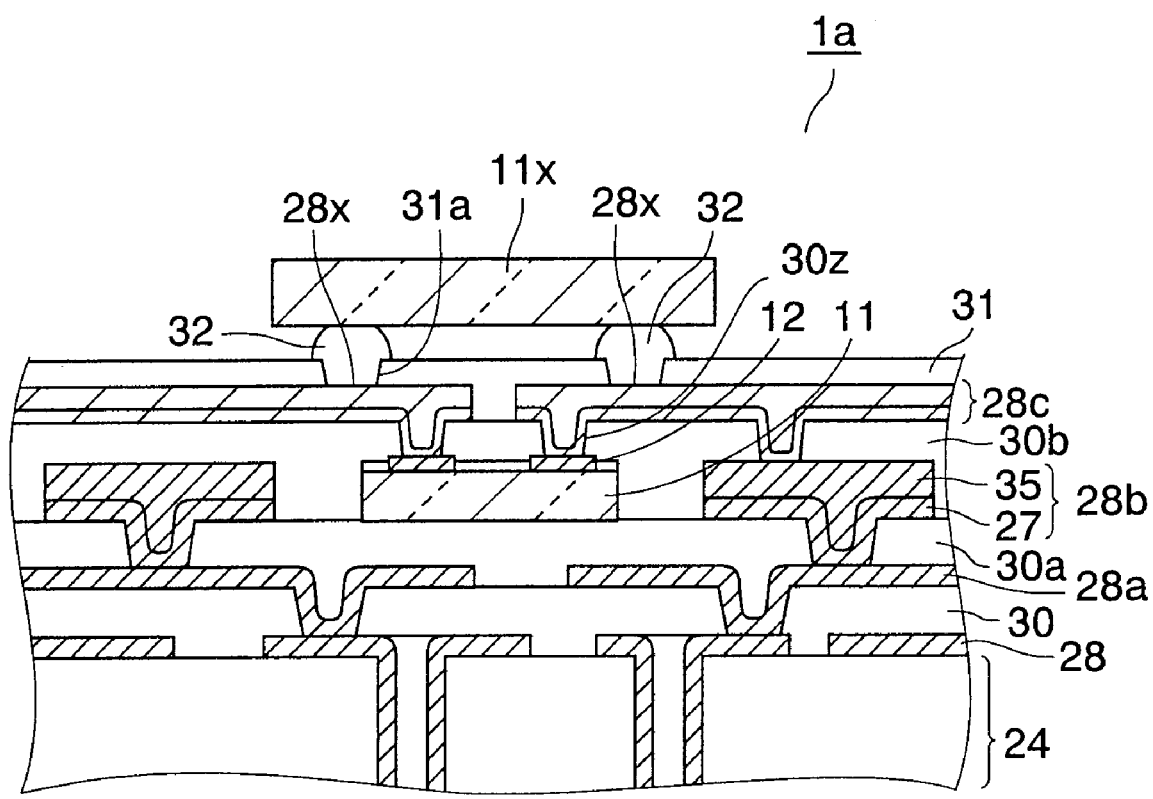

Then, as shown in FIG. 3K, according to the same method as the steps in FIG. 2L to FIG. 2N in the first embodiment, the fourth wiring patterns 28c connected to the connection terminals 12 of the semiconductor chips 11, etc. via the third via holes 30z are formed on the third interlayer insulating film 30b. Then, the solder resist film 31 having the opening portions 31 a to expose the connecting portions 28x is formed on the fourth wiring patterns 28c. Then, the bumps 32 of semiconductor chip 11x are bonded to the connecting portions 28x of the fourth wiring patterns 28c by the flip-chip bonding.

With the above, a semiconductor device 1a (electronic parts packaging structure) according to the second embodiment is completed.

In this case, in the second embodiment, the semiconductor chips 11 are mounted on the third interlayer insulating film 30b after the step in FIG. 3J, and then the fourth wiring patterns 28c that are similar to the third wiring patterns 28b are formed. Thus, the mode that the interlayer insulating films in which the semiconductor chips 11 are built respectively are formed in a multi-layered fashion and also a plurality of semiconductor chips are connected mutually may be implemented.

The semiconductor device 1a according to the second embodiment can achieve the same advantages as the first embodiment. In addition, in the second embodiment, since the step of forming the die attaching member on the back surface of the silicon wafer 10 can be omitted, a production cost can be lowered rather than the first embodiment.

Further, since the die attaching member is omitted, the film thickness of the third wiring patterns 28b can be set only by taking account of the thickness of the semiconductor chips 11. Therefore, the film thickness of the third wiring patterns 28b is never increased unnecessarily.

(Third Embodiment)

FIG. 4A to FIG. 4F are partial sectional views showing a method of manufacturing an electronic parts packaging structure according to a third embodiment of the present invention. A different point of the third embodiment from the first embodiment reside in that the die attaching member is not formed on the back surfaces of the semiconductor chips 11 but a tape containing the adhesive material is employed as the dicing tape, and then such adhesive material is transferred onto the back surfaces of the semiconductor chips 11 when the semiconductor chips 11 are picked up from the dicing tape. In this case, detailed explanation of the same steps as those in the first and second embodiments will be omitted herein. Also, in FIG. 4A to FIG. 4F, the same reference symbols are affixed to the same elements as those in FIG. 2A to FIG. 2N and FIG. 3A to FIG. 3K, and their explanation will be omitted herein.

Figure 4A:
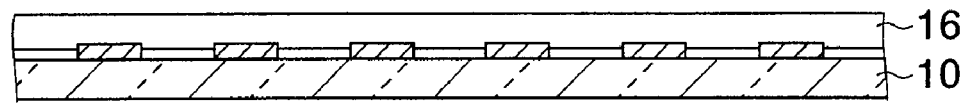
FIG. 4A to FIG. 4F are partial sectional views showing a method of manufacturing an electronic parts packaging structure according to a third embodiment of the present invention.

In the method of manufacturing the electronic parts packaging structure according to the third embodiment of the present invention, as shown in FIG. 4A, first the silicon wafer 10, the element formation surface of which is covered with the mask member 16 and the thickness of which is thinned, like FIG. 2C in the first embodiment, is obtained by the same method as the first embodiment.

Figure 4B:
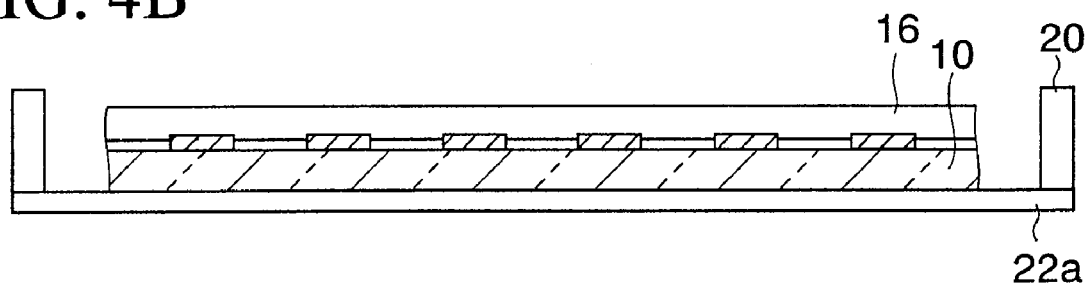

Then, as shown in FIG. 4B, a dicing tape 22a fixed to the outer frame 20 is prepared. The dicing tape 22a used in the third embodiment has a function capable of transferring the adhesive material onto the back surface of the silicon wafer 10 that is pasted onto the dicing tape 22a. As such dicing tape 22a, "LE5000" manufactured by Lintec Corporation, for example, may be employed.

Figure 4C:
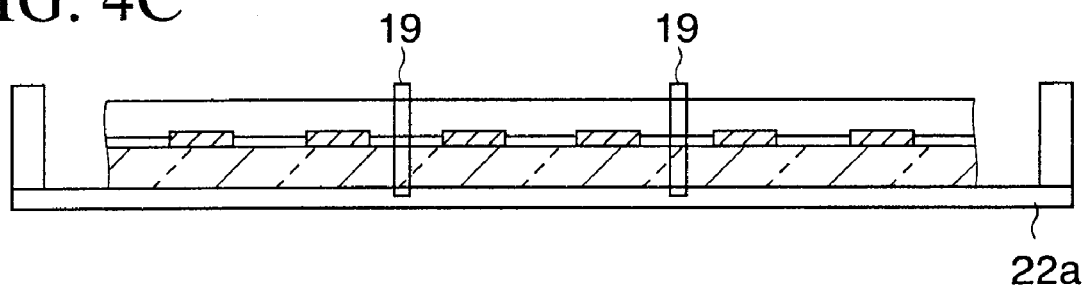

Then, as shown in FIG. 4C, the back surface of the silicon wafer 10 is adhered temporarily onto the dicing tape 22a by the same method as the first embodiment, and then the silicon wafer 10 is diced by the dicing saw having the dicing blade 19.

Figure 4D:
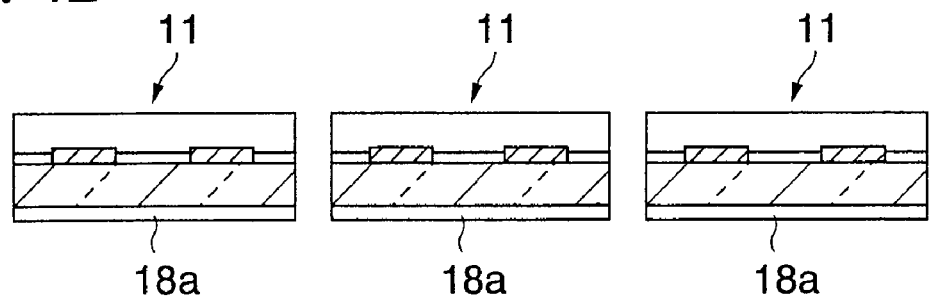

Then, as shown in FIG. 4D, a plurality of semiconductor chips 11 that are divided into individual pieces are obtained by picking up the semiconductor chips 11 from the dicing tape 22a. At this time, adhesive material 18a contained in the dicing tape 22a are transferred onto the back surfaces of the semiconductor chips 11 and are left.

Figure 4E:
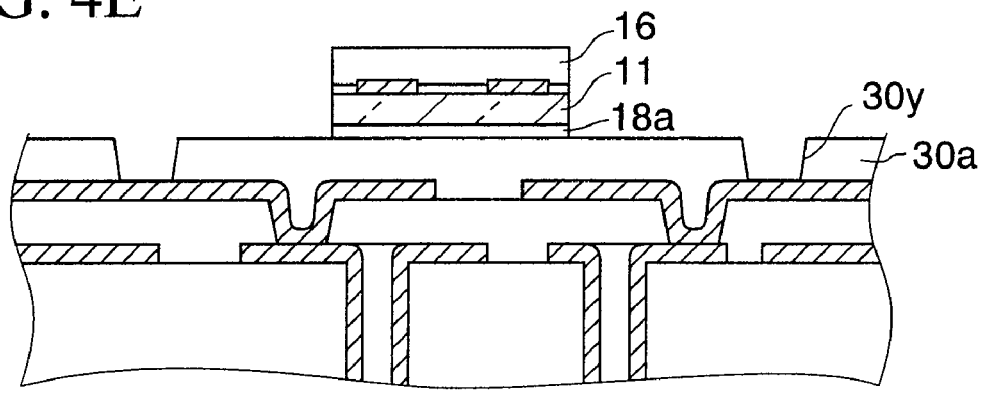

Then, as shown in FIG. 4E, a wiring substrate which has the same structure as the wiring substrate in FIG. 3E in the second embodiment and in which the second interlayer insulating film 30a has not the tacky property (adhesiveness) is prepared. Then, surfaces of the above adhesive material 18a on the semiconductor chips 11 are adhered onto the packaging areas of the second interlayer insulating film 30a.

Figure 4F:
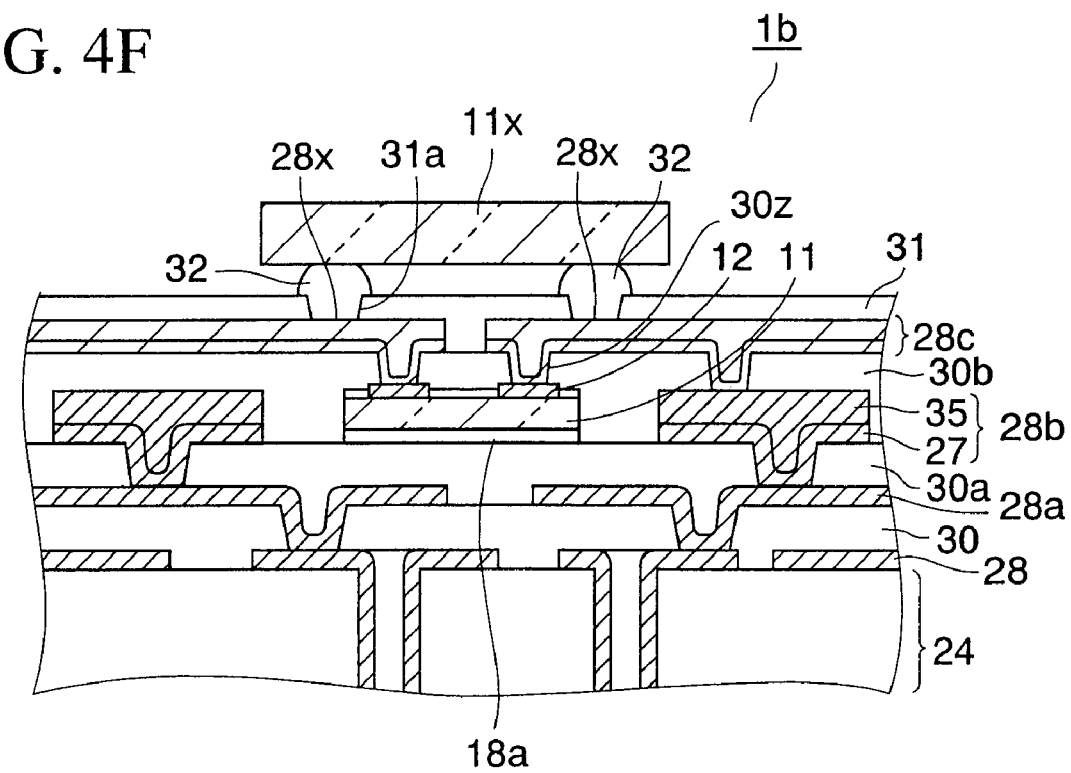

Then, as shown in FIG. 4F, a semiconductor device 1b (electronic parts packaging structure) according to the third embodiment is completed by carrying out the same steps as those in FIG. 3G to FIG. 3K in the second embodiment.

Here, in the third embodiment, the third wiring patterns 28b are formed after the semiconductor chips 11 are mounted like the second embodiment. However, like the first embodiment, the third wiring patterns 28b are formed, then the mask member 16 on the semiconductor chips 11 is removed, and then the semiconductor chips 11 may be mounted. In this case, the resultant structure is brought into the same state as FIG. 21 in the first embodiment at a point of time when the semiconductor chips 11 are mounted.

The semiconductor device 1b according to the third embodiment can achieve the same advantages as those in the first embodiment. Also, since it is not needed to form particularly the die attaching member 18 on the back surface of the silicon wafer 10 like the second embodiment, a production cost can be lowered.

In the third embodiment, various modifications and variations may also be applied like the first and second embodiments.

(Other Embodiment)

In the first to third embodiments, the wiring patterns (e.g., third wiring patterns 28b) formed on the same film as the interlayer insulating film (e.g., second interlayer insulating film 30a), on which the semiconductor chips are mounted, are formed to have the film thickness that coincides with the thickness of the semiconductor chips. In contrast, other wiring patterns are set to the film thickness that is decided by taking the wiring resistance, etc. into consideration.

Therefore, in the first to third embodiments, in some cases the film thickness of the wiring patterns formed on the interlayer insulating film, on which the semiconductor chips are mounted, is different from the film thickness of the wiring patterns formed on other interlayer insulating films.

In the first to third embodiments, if the thickness of the semiconductor chips can be thinned sufficiently (about 10 μm), a plurality of wiring patterns laminated on the wiring substrate may be set to the equal film thickness respectively.

What is claimed is:

1. A method of manufacturing an electronic parts packaging structure, comprising the steps of:

forming a wiring pattern in an area except a packaging area on a mounted body, the packaging area in which an electronic part is mounted;

mounting the electronic part in the packaging area of the mounted body to direct a surface of the electronic part, of which a connection terminal is formed, upward; and forming an insulating film which covers the electronic part and the wiring pattern;

wherein an upper surface of the electronic part and an upper surface of the wiring pattern are formed at an almost same height, and the insulating film is planarized and formed.

2. A method of manufacturing an electronic parts packaging structure, comprising the steps of:

mounting an electronic part in a packaging area on a mounted body, the packaging area in which the electronic part is mounted, to direct a surface of the electronic part, of which connection terminal is formed, upward;

forming a wiring pattern in an area except the packaging area on the mounted body; and forming an insulating film which covers the electronic part and the wiring pattern;

wherein an upper surface of the electronic part and an upper surface of the wiring pattern are formed at an almost same height, and the insulating film is planarized and formed.

3. A method of manufacturing an electronic parts packaging structure, according to claim 1, after the step of forming an insulating film, further comprising the steps of:

forming a via hole in the insulating film on the connection terminal of the electronic parts part and the wiring pattern; and forming an overlying wiring pattern, which is connected electrically to the connection terminal of the electronic part and the wiring pattern via the via hole, on the insulating film.

4. A method of manufacturing an electronic parts packaging structure, according to claim 1, wherein the mounted body is an insulating base substrate or an insulating film formed on or over the base substrate.

5. A method of manufacturing an electronic parts packaging structure, according to claim 2, wherein the mounted body is an insulating film formed on or over the base substrate, and the insulating film is made of a resin film having adhesiveness in an uncured state, and the step of mounting the electronic part includes the step of adhering the electronic part onto the resin film having adhesiveness, and after the step of mounting the electronic part and before the step of forming the wiring pattern, further comprising the step of:

curing the resin film by executing an annealing.

6. A method of manufacturing an electronic parts packaging structure, according to claim 1, wherein the electronic part is obtained by dicing a wafer, on which a predetermined element is formed, into individual pieces in a state that a back surface of the wafer is pasted onto a dicing tape on which an adhesive material can be transferred, the adhesive material that is transferred from the dicing tape is left on the back surfaces of the electronic part after the electronic part is released from the dicing tape, and the step of mounting the electronic part is the step of adhering back surfaces of the electronic part onto the mounted body via the adhesive material.

7. A method of manufacturing an electronic parts packaging structure, according to claim 1, wherein the electronic part is a semiconductor chip, a thickness of which is about 50 μm or less.

* * * * *